(12) United States Patent
Chen

(10) Patent No.: US 8,650,441 B2
(45) Date of Patent: Feb. 11, 2014

(54) DATA PROGRAMMING CIRCUIT AND METHOD FOR OTP MEMORY

(75) Inventor: Yung-Wei Chen, Taipei (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 247 days.

(21) Appl. No.: 13/215,037

(22) Filed: Aug. 22, 2011

(65) Prior Publication Data

US 2012/0054545 A1 Mar. 1, 2012

(30) Foreign Application Priority Data

Aug. 31, 2010 (TW) .............................. 99129217 A

(51) Int. Cl.
*G06F 11/00* (2006.01)
(52) U.S. Cl.
USPC .................................. 714/12; 714/21; 714/15
(58) Field of Classification Search
USPC .......................................................... 714/12
See application file for complete search history.

(56) References Cited

U.S. PATENT DOCUMENTS

| | | | | |
|---|---|---|---|---|
| 6,006,305 | A * | 12/1999 | Fox | 711/103 |
| 6,836,834 | B2 * | 12/2004 | Schulze et al. | 711/200 |
| 7,778,074 | B2 * | 8/2010 | Ahmed | 365/185.04 |
| 8,032,727 | B2 * | 10/2011 | Brownhill et al. | 711/163 |
| 2004/0098428 | A1 * | 5/2004 | Schulze et al. | 707/205 |
| 2006/0179325 | A1 * | 8/2006 | Debiez | 713/193 |
| 2007/0025134 | A1 * | 2/2007 | Riva Reggiori et al. | 365/94 |
| 2007/0208908 | A1 * | 9/2007 | Moore et al. | 711/103 |
| 2007/0226400 | A1 * | 9/2007 | Tsukazaki | 711/102 |
| 2008/0258757 | A1 * | 10/2008 | Archibald et al. | 326/38 |
| 2009/0146687 | A1 * | 6/2009 | Archibald et al. | 326/38 |
| 2011/0182101 | A1 * | 7/2011 | Bae | 365/94 |
| 2012/0278546 | A1 * | 11/2012 | Yu et al. | 711/103 |

* cited by examiner

*Primary Examiner* — Kamini Patel
(74) *Attorney, Agent, or Firm* — McClure, Qualey & Rodack, LLP

(57) ABSTRACT

A data programming circuit is provided. The data programming circuit includes a one-time-programmable (OTP) memory and a control unit. The control unit stores a plurality of sections of a read-only memory (ROM) code into a free space of the OTP memory. In response to the sections of the plurality of sections that have the same content, the control unit stores a specific address into the OTP memory.

22 Claims, 8 Drawing Sheets

DATA PROGRAMMING CIRCUIT AND METHOD FOR OTP MEMORY

CROSS REFERENCE TO RELATED APPLICATIONS

This Application claims priority of Taiwan Patent Application No. 099129217, filed on Aug. 31, 2010, the entirety of which is incorporated by reference herein.

BACKGROUND OF THE INVENTION

1. Field of the Invention

The present invention is related to one-time-programmable (OTP) memories, and more particularly to data programming methods for OTP memories.

2. Description of the Related Art

With the rapid development of consumer electronic products, solid-state data storage has become increasingly important. The small size, simple structure, and low cost of the solid-state data storage are especially desired for portable consumer products. Solid-state data storage technologies (e.g. EPROM, EEPROM etc.) have been optimized for high-speed applications, resulting in complex and expensive processes.

However, for many consumer applications, low cost is more important than speed. Thus, a non-volatile one-time-programmable (OTP) memory having lower manufacturing cost, in which stored information does not disappear even when the power supply is turned off, is an essential element. The OTP memory is widely used for the purposes of, e.g., redundancy of a large-capacity memory such as a DRAM or SRAM, calibrating of an analog circuit, code storage of, e.g., an encryption key, and storage of management information such as the log in the fabrication process. Furthermore, the OTP memory is characterized by that the data stored therein can only be programmed once. In other words, data modification on any of the memory cells of the OTP memory is not allowed once the memory cell is programmed.

For an OTP read only memory (ROM), data can be written into the memory after leaving the factory, i.e. the operating environment and applications of the memory can be programmed through a write-in operation carried out by users in their premises. Thus, the OTP memory is more convenient to use when compared with other memories, such as a mask ROM.

BRIEF SUMMARY OF THE INVENTION

A data programming circuit and a data programming method are provided. An embodiment of a data programming circuit is provided. The data programming circuit comprises a one-time-programmable (OTP) memory and a control unit. The control unit stores a plurality of sections of a read-only memory (ROM) code into a free space of the OTP memory. In response to the sections of the plurality of sections that have the same content, the control unit stores a specific address into the OTP memory.

Furthermore, an embodiment of a data programming method for storing a read-only memory (ROM) code into a one-time-programmable (OTP) memory is provided. The ROM code is encoded. A start address and an end address of a free space of the OTP memory are obtained according to the encoded ROM code. The start and end addresses are written into a stack section of the OTP memory, and it is determined whether the start and end addresses have been written into the stack section or not. The encoded ROM code is written into the free space of the OTP memory when the start and end addresses have been written into the stack section successfully. A specific address is stored into the free space of the OTP memory in response to the sections of the plurality of sections of the ROM code that have the same content.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
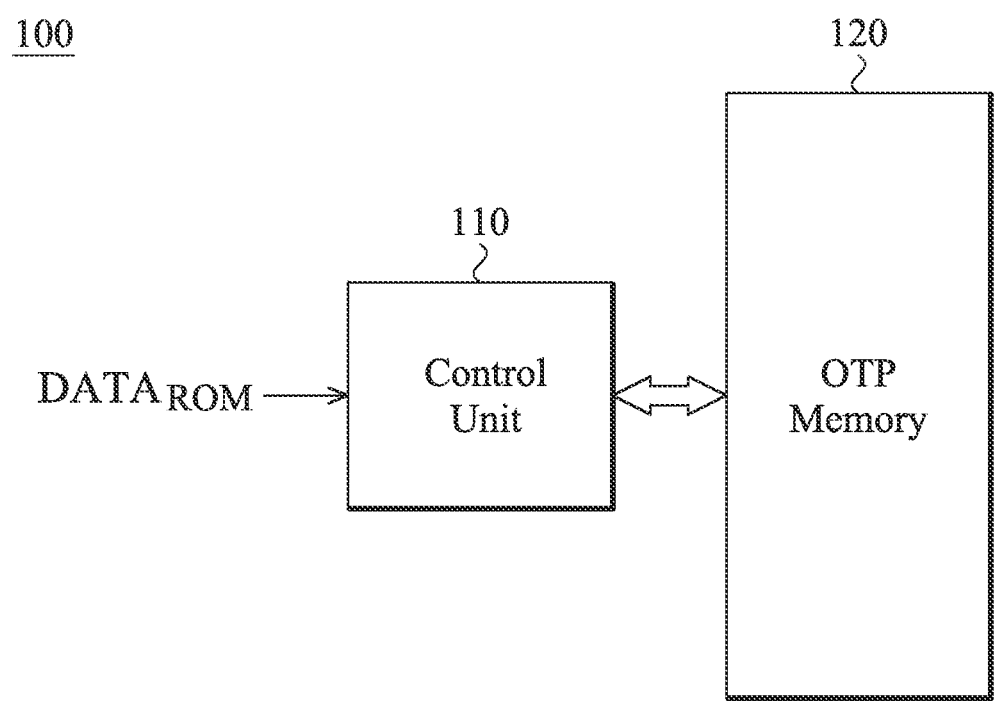
FIG. 1 shows a data programming circuit according to an embodiment of the invention.

FIG. 1 shows a data programming circuit 100 according to an embodiment of the invention. The data programming circuit 100 comprises a control unit 110 and a one-time-programmable (OTP) memory 120. In the data programming circuit 100, a read-only memory (ROM) code $DATA_{ROM}$ is processed (e.g. encoded, compressed and so on) by the control unit 110, and then the processed data is stored into the OTP memory 120, thus using a smaller storage capacity to store the ROM code $DATA_{ROM}$ for a user. In addition, the data programming circuit 100 can be applied to various electronic products.

Figure 2:
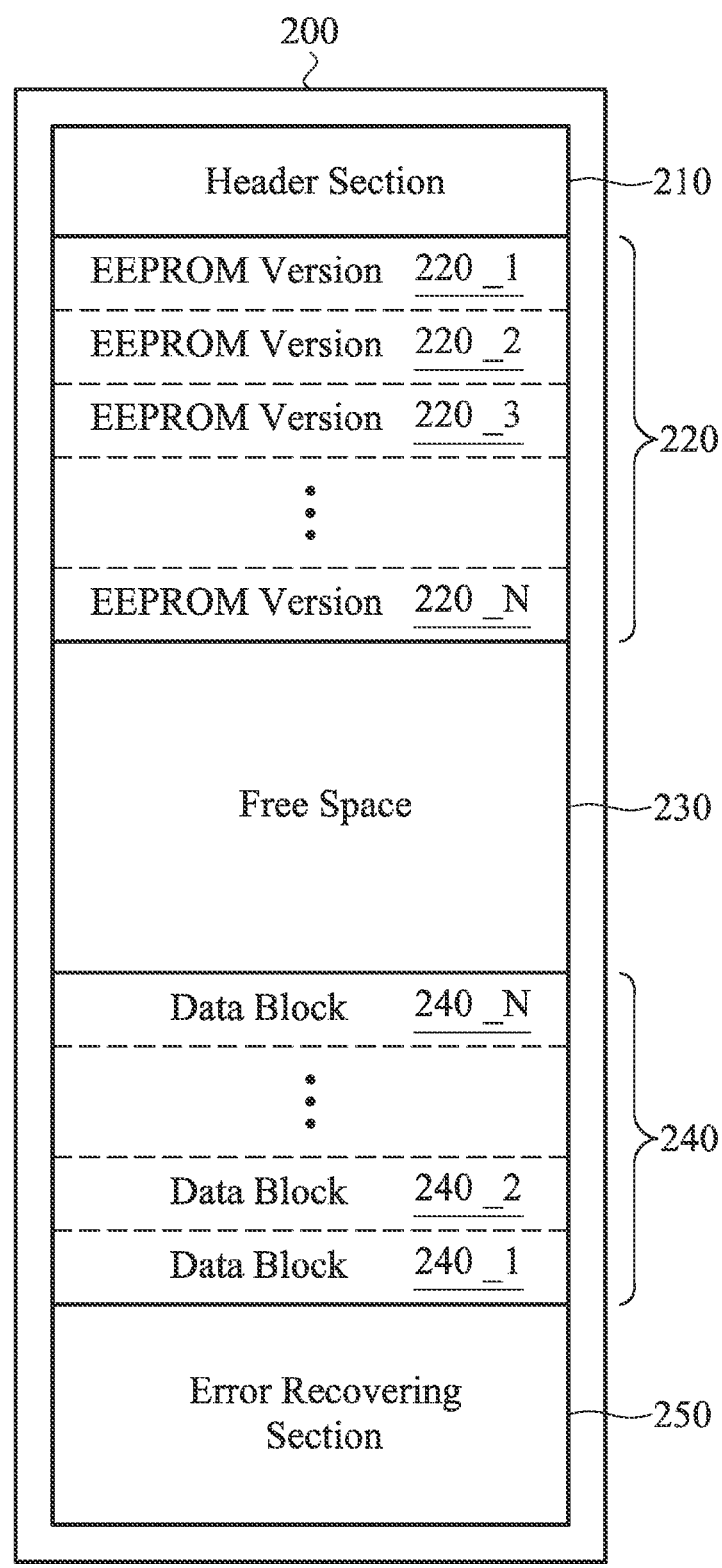
FIG. 2 shows a layout diagram illustrating a memory map of the data stored in an OTP memory according to an embodiment of the invention.

FIG. 2 shows a layout diagram illustrating a memory map of the data stored in an OTP memory 200 according to an embodiment of the invention. The OTP memory 200 is divided into various sections. For example, in FIG. 2, the OTP memory 200 comprises a header section 210, a data section 220, a free space 230, a start address stack section 240 and an error recovering section 250, wherein each of the sections is formed by a plurality of bytes. The header section 210 is used to store major information of the OTP memory 200, such as an actual size of the OTP memory 200, whether the OTP memory 200 can continue to be written or whether the OTP memory 200 can be used/read (i.e. whether to bypass the OTP memory 200 due to the OTP memory 200 being damaged). The data section 220 comprises a plurality of EEPROM versions 220_1 to 220_N which are the encoded EEPROM versions previously written to the OTP memory 200, wherein each of the EEPROM versions comprises a plurality of data segments. The free space 230 is the space that is not used in the OTP memory 200. The start address stack section 240 is used to store a start address and an end address of each EEPROM version in the data section 220, and the start address stack section 240 is also used to record whether each EEPROM version is normal or not. The error recovering section 250 has a fixed size, which is used to record the information, e.g. data to be stored in the damaged memory cells of the OTP memory 200 and addresses corresponding to the damaged memory cells, for a access unit of the OTP memory 200 (e.g. the control unit 110 of FIG. 1) to perform recovery.

Referring to FIG. 1 and FIG. 2 together, the content of the OTP memory 200 is installed to "0" by the control unit 110 first. Next, the control unit 110 writes the first encoded EEPROM version 220_1 below the header section 210. In the embodiment, the control unit 110 writes data into the OTP memory 200 with byte per unit. Moreover, before writing the EEPROM version 220_1 into the OTP memory 200, the control unit 110 obtains the start and end addresses corresponding to the EEPROM version 220_1 according to data length of the EEPROM version 220_1 and writes the start and end addresses into the start address stack section 240. In the embodiment, the control unit 110 writes the start and end addresses of the EEPROM version 220_1 into the different fields within a data block 240_1, wherein the data block 240_1 is adjacent to the error recovering section 250. Similarly, the control unit 110 may sequentially write the new EEPROM versions (e.g. the EEPROM versions 220_2 to 220_N) into the free space 230, so as to update the OTP memory 200. In the meantime, the control unit 110 also writes the start and end addresses of the update EEPROM version into the different fields of the corresponding data block in the start address stack section 240. For example, the start and end addresses corresponding to the EEPROM version 2202 are stored in a data block 2402, and the start and end addresses corresponding to the EEPROM version 220_N are stored in a data block 240_N. In the embodiment of FIG. 2, the control unit 110 updates the EEPROM versions into the OTP memory 200 with a top-down approach, i.e. in a direction from the header section 210 to the start address stack section 240. In addition, the control unit 110 writes the start and end addresses corresponding to the updated EEPROM versions into the OTP memory 200 with a bottom-up approach, i.e. in a direction from the error recovering section 250 to the data section 220.

In FIG. 2, the free space 230 is between the data section 220 and the start address stack section 240. Therefore, before writing the new EEPROM version into the OTP memory 200, the control unit 110 needs to confirm whether the free space 230 has enough space for storage. If yes, the control unit 110 writes the start and end addresses corresponding to the new EEPROM version into the start address stack section 240, and then the control unit 110 writes data of the new EEPROM version into the free space 230 below the last version EEPROM data. On the contrary, if the free space 230 does not have enough space to store the new EEPROM version, the control unit 110 does not perform any writing program for the OTP memory 200.

Due to process drift, some memory cells may be damaged in the OTP memory 200. Therefore, after a byte data is written into a data block corresponding to a specific address in the OTP memory 200, the control unit 110 must proceed to read back (verify after program) the content stored in the data block corresponding to the specific address from the OTP memory 200, to verify that the byte data has been written into the OTP memory 200 successfully. If the read content is different from the written byte data, the control unit 110 may determine that the data block corresponding to the specific address is damaged and can not be used. Next, the control unit 110 performs an error recovering procedure, so as to write the byte data and the specific address into a data block of the error recovering section 250. In the embodiment, the control unit 110 searches the error recovering section 250 with a bottom-up approach, to find the empty data blocks in the error recovering section 250, so as to perform the error recovering procedure. If the empty data blocks exist, the control unit 110 writes the byte data and the specific address into a free block that is the first empty data block found in the error recovering section 250. If no empty data block exists, the control unit 110 writes a message representing that updating the OTP memory 220 can not be continued, into the header section 210, thereby the OTP memory 200 only can be read and can not be updated. In the OTP memory 200, any section may have damaged memory cells therein. Therefore, before a data block of the OTP memory 200 is read in response to a read address, the control unit 110 needs to check whether the address stored in the error recovering section 250 is identical to the read address. If yes, the control unit 110 may read the data corresponding to the read address from a data block of the error recovering section 250 due to the original data block of the data section 220 corresponding to the read address being damaged. If no, the control unit 110 may directly read the content from the original data block according to the read address. Furthermore, when the EEPROM version is updated, the control unit 110 may first write an end address of the EEPROM version into the start address stack section 240 and then read it back, so as to determine whether to perform the error recovering procedure for the end address. If the read content is identical to the written end address, the control unit 110 further writes a start address of the EEPROM version into the start address stack section 240 and then reads it back, so as to determine whether to perform the error recovering procedure for the start address. Similarly, if the read content is identical to the written start address, the control unit 110 may determine that the start and end addresses of the EEPROM version have been written into the start address stack section 240 successfully.

Figure 3:
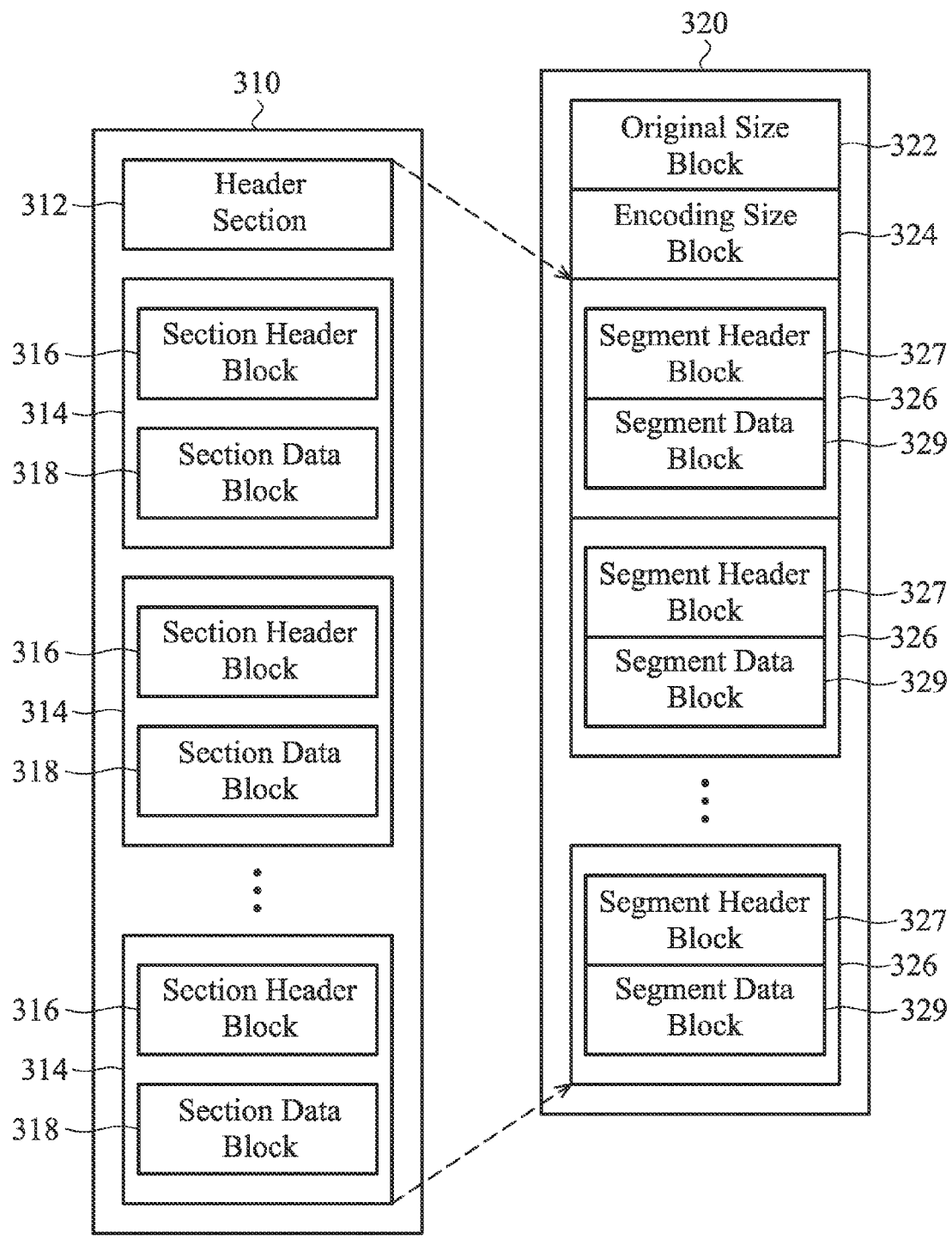
FIG. 3 shows a diagram illustrating encoding an EEPROM version to be updated by the control unit of FIG. 1 according to an embodiment of the invention.

FIG. 3 shows a diagram illustrating encoding an EEPROM version to be updated by the control unit 110 of FIG. 1 according to an embodiment of the invention, wherein label 310 represents a layout diagram illustrating an original data of the ROM code $DATA_{ROM}$ received by the control unit 110, and label 320 represents a layout diagram illustrating an EEPROM data of the ROM code $DATA_{ROM}$ encoded by the control unit 110. First, the original ROM code $DATA_{ROM}$ 310 comprises a header section 312 and a plurality of data sections 314, wherein each data section 314 comprises a section header block 316 and a section data block 318. Next, the control unit 110 encodes the total data sections 314 within the ROM code $DATA_{ROM}$ 310 to obtain a plurality of data segments 326, wherein each data segment 326 comprises a segment header block 327 and a segment data block 329. In addition, the encoded EEPROM data 320 further comprises an original size block 322 and an encoding size block 324, wherein the original size block 322 is used to record an original data length of the ROM code $DATA_{ROM}$ (e.g. 310) and the encoding size block 324 is used to record a data length of the encoded ROM code $DATA_{ROM}$ (e.g. 320). In general, the original data length of the ROM code $DATA_{ROM}$ is larger than that of the encoded ROM code $DATA_{ROM'}$.

Figure 4A:
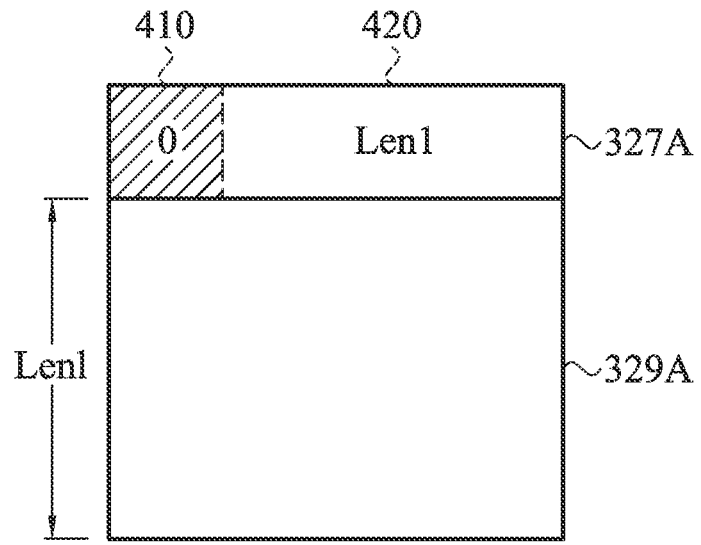
FIG. 4A shows a data segment encoded by a control unit according to an embodiment of the invention.
Figure 4B:
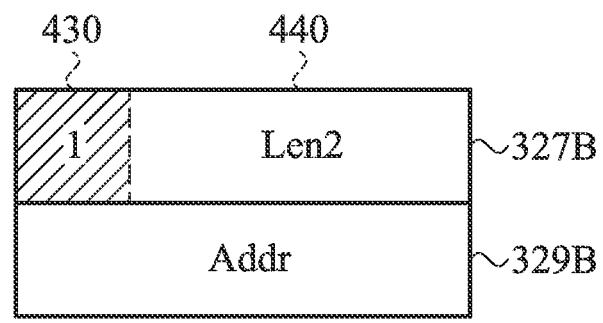
FIG. 4B shows a data segment according to another embodiment of the invention.

Referring to FIG. 1, when the original data of the ROM code $DATA_{ROM}$ is to be encoded and programmed to the OTP memory 120, the control unit 110 may first determine whether the section currently to be encoded in the ROM code $DATA_{ROM}$ and the sections previously written into the OTP memory 120 have the same content. If no, the control unit 110 directly writes the section into the OTP memory 120, as shown in FIG. 4A. FIG. 4A shows a data segment 326A encoded by the control unit 110 of FIG. 1 according to an embodiment of the invention. The data segment 326A comprises a segment header block 327A and a segment data block 329A, wherein the segment header block 327A comprises a flag field 410 and a length field 420. In FIG. 4A, the flag field 410 is set to "0" to indicate that the segment data block 329A is raw data that has not been compressed, and the length field 420 is used to record a data length Len1 of the data in the segment data block 329A that has not been compressed. On the contrary, when it is determined that the section currently to be encoded and a section previously written into the OTP memory 120 have the same content, the control unit 110 will not re-encode the content of the section. At this time, the control unit 110 stores an address corresponding to the section, previously written into the OTP memory 120 and having the same content as the section that is not re-encoded by the control unit 110, into the OTP memory 120, as shown in FIG. 4B. FIG. 4B shows a data segment 326B according to another embodiment of the invention. The data segment 326B comprises a segment header block 327B and a segment data block 329B. Similarly, the segment header block 327B comprises a flag field 430 and a length field 440. In FIG. 4B, the flag field 430 is set to "1" by the control unit 110, so as to indicate that the content stored in the segment data block 329B is a specific address Addr which points to a previously written data segment. Furthermore, the length field 440 is used to record a data length Len2 of the previously written data segment. Therefore, the control unit 110 will not re-encode the sections having the same content, thereby encoding time and data quantity to be stored are decreased.

Figure 5:
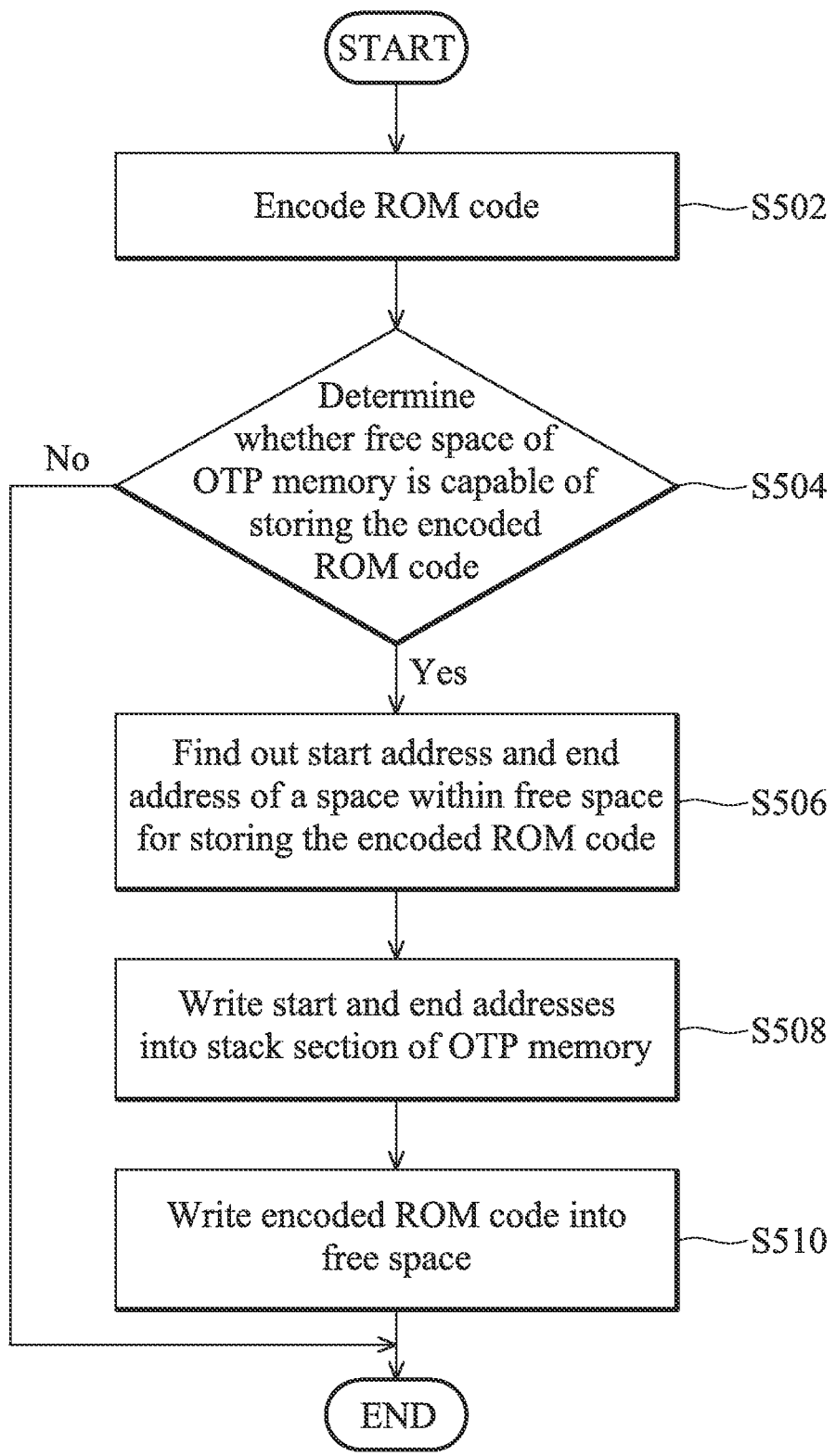
FIG. 5 shows a data programming method according to an embodiment of the invention.

FIG. 5 shows a data programming method for storing a ROM code into an OTP memory by a control unit (e.g. 110 of FIG. 1) according to an embodiment of the invention. First, the control unit encodes the ROM code, and obtains a data length of the encoded ROM code (step S502). Next, in step S504, the control unit determines whether a free space of the OTP memory is capable of storing the encoded ROM code according to the data length of the encoded ROM code. If no, the data programming process finishes in step S504. If yes, according to the data length of the encoded ROM code, the control unit finds out a start address and an end address of a space within the free space (step S506), wherein the space of the free space is suitable for storing the encoded ROM code. Next, the control unit writes the start and end addresses into a stack section of the OTP memory (step S508). Next, the control unit writes the encoded ROM code into the space of the free space (step S510). As described above, when the start address, the end address or the encoded ROM code is written into a data block of the OTP memory, the control unit may read back the content of the data block, so as to determine whether the write operation is normal. If yes, the control unit continues to write the subsequent data of the encoded ROM code into the OTP memory. If no, the control unit determines that the data block is damaged, and then the control unit performs an error recovering procedure, so as to store the data to be written and an address corresponding to the damaged data block into an error recovering section of the OTP memory. Thus, the stored content can be read correctly when the control unit or other circuits wants to read the OTP memory. In addition, for the sections of the ROM code that have the same content, the control unit does not re-encode the same content/data, and the control unit stores a specific address into the OTP memory in response to the sections having the same content, wherein the specific address points to a previously written section having the same content, as described above.

Figure 6:
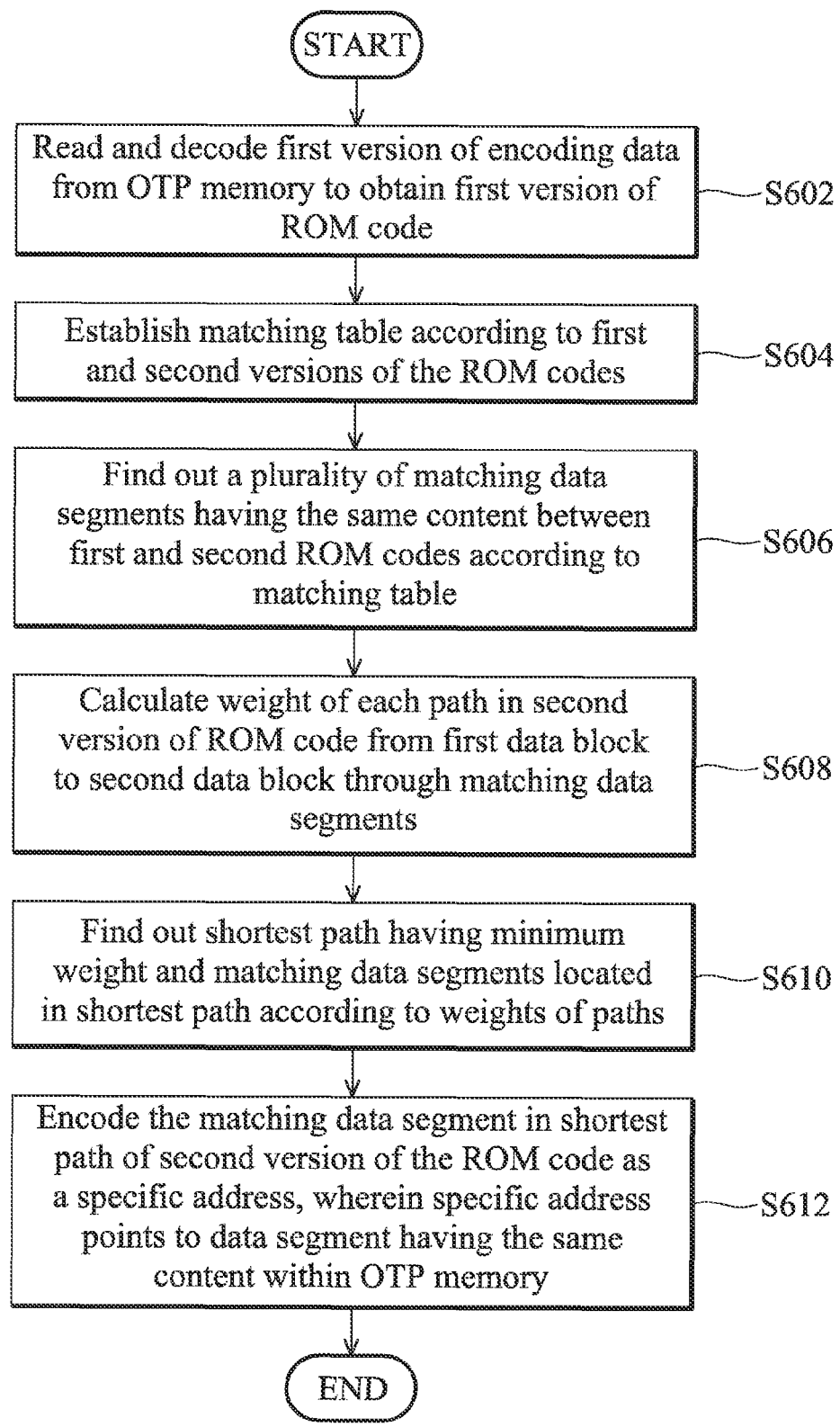
FIG. 6 shows a data programming method according to another embodiment of the invention.
Figure 7:
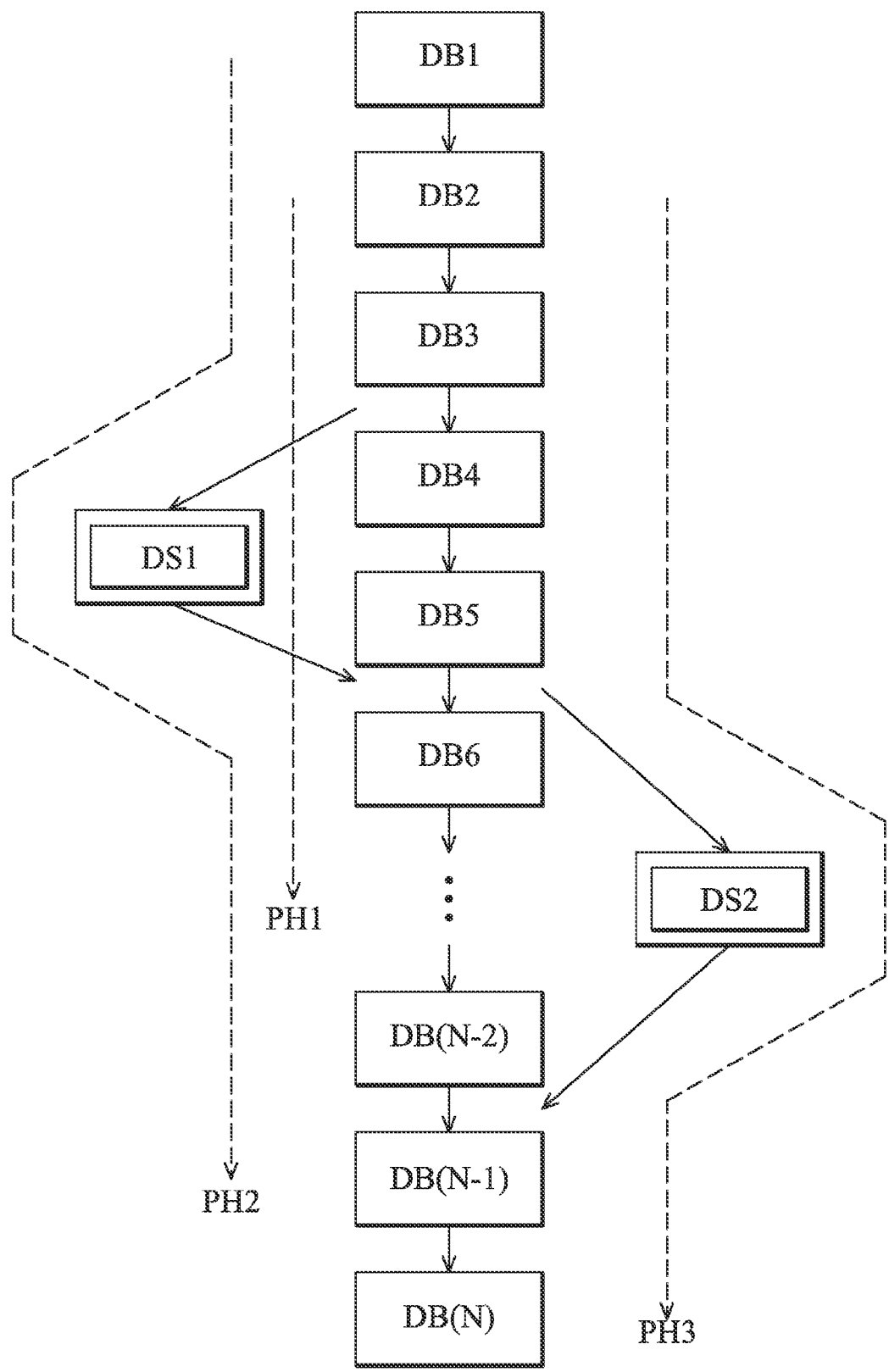
FIG. 7 shows a diagram illustrating various paths in a second version of the ROM code from the data block DB1 to the data block DBN.

FIG. 6 shows a data programming method for storing a second version of the ROM code into an OTP memory according to an embodiment of the invention, wherein a first version of the encoding data corresponding to a first version of the ROM code is stored in the OTP memory. First, in step S602, the control unit reads the first version of the encoding data from the OTP memory, and decodes the first version of the encoding data to obtain the first version of the ROM code. Next, in step S604, the control unit establishes a matching table according to the first and second versions of the ROM codes. For example, the control unit may obtain the matching table between different versions of the ROM codes by using the longest common subsequence algorithm. Next, in step S606, the control unit finds out a plurality of matching data segments having the same content between the first and second ROM codes according to the matching table. Furthermore, in one embodiment, the control unit further selects the matching data segments with a data length larger than a specific threshold length from the plurality of matching data segments, so as to simplify subsequent operations. Next, in step S608, the control unit calculates a weight of each path in the second version of the ROM code from a first data block to a second data block through the matching data segments. For example, referring to FIG. 7, FIG. 7 shows a diagram illustrating various paths in the second version of the ROM code from a data block DB1 to a data block DBN. In FIG. 7, a path PH1 shows a path from the data block DB1 to the data block DBN which is sequentially through the data blocks DB2, DB3, . . . , DB(N–2) and DB(N–1). A path PH2 shows a path from the data block DB1 to the data block DBN which is sequentially through the data blocks DB2 and DB3, a matching data segment DS1 and the data blocks DB6 to DB(N–1). A path PH3 shows a path from the data block DB1 to the data block DBN which is sequentially through the data blocks DB2-DB5, a matching data segment DS2 and the data block DB(N–1). Thus, the control unit may calculate the weights of the paths PH1, PH2 and PH3, respectively. In the embodiment, for a data block, the weight is obtained according to the occupied space of the data block in the OTP memory. In addition, each matching data segment (e.g. DS1 and DS2) corresponds to a specific data segment of the first version of the encoding data stored in the OTP memory. Thus, when wanting to store a matching data segment of the second version of the ROM code into the OTP memory, the control unit encodes the matching data segment as a specific address which points to a corresponding specific data segment of the first version of the encoding data in the OTP memory. Therefore, if the control unit wants to store the matching data segment into the OTP memory, the control unit only needs to write the specific address into the OTP memory and not all of the data blocks within the matching data segment, as shown in FIG. 4B. In the embodiment, each of the matching data segments may correspond to a specific address of the first version of the encoding data in the OPT memory, i.e. each of the matching data segments is encoded as a specific address by the control unit. Therefore, each of the matching data segments has the same weight, which has no relationship with a quantity of data blocks therein.

Referring to FIG. 6 and FIG. 7 together, in step S610, the control unit finds out a shortest path having a minimum weight and the matching data segments located in the shortest path according to the weights of the paths obtained in step S608. For example, in the example of FIG. 7, the control unit finds that the path PH3 is the shortest path having the minimum weight, and finds the matching data segment DS2 located in the path PH3. Next, in step S612, the matching data segment in the shortest path of the second version of the ROM code is encoded as a specific address, wherein the specific address points to the data segment having the same content within the OTP memory. Therefore, after the total shortest paths of the second version of the ROM code are found out and encoded, the control unit starts to store the second version of the encoded ROM code into the OTP memory. As described above, if the second version of the encoded ROM code is being stored into the OTP memory by the control unit, the control unit also needs to check the free space of the OTP memory, and then writes the start and end addresses into the start address stack section and determines whether to perform the error recovering procedure, as described in FIG. 5.

Figure 8:
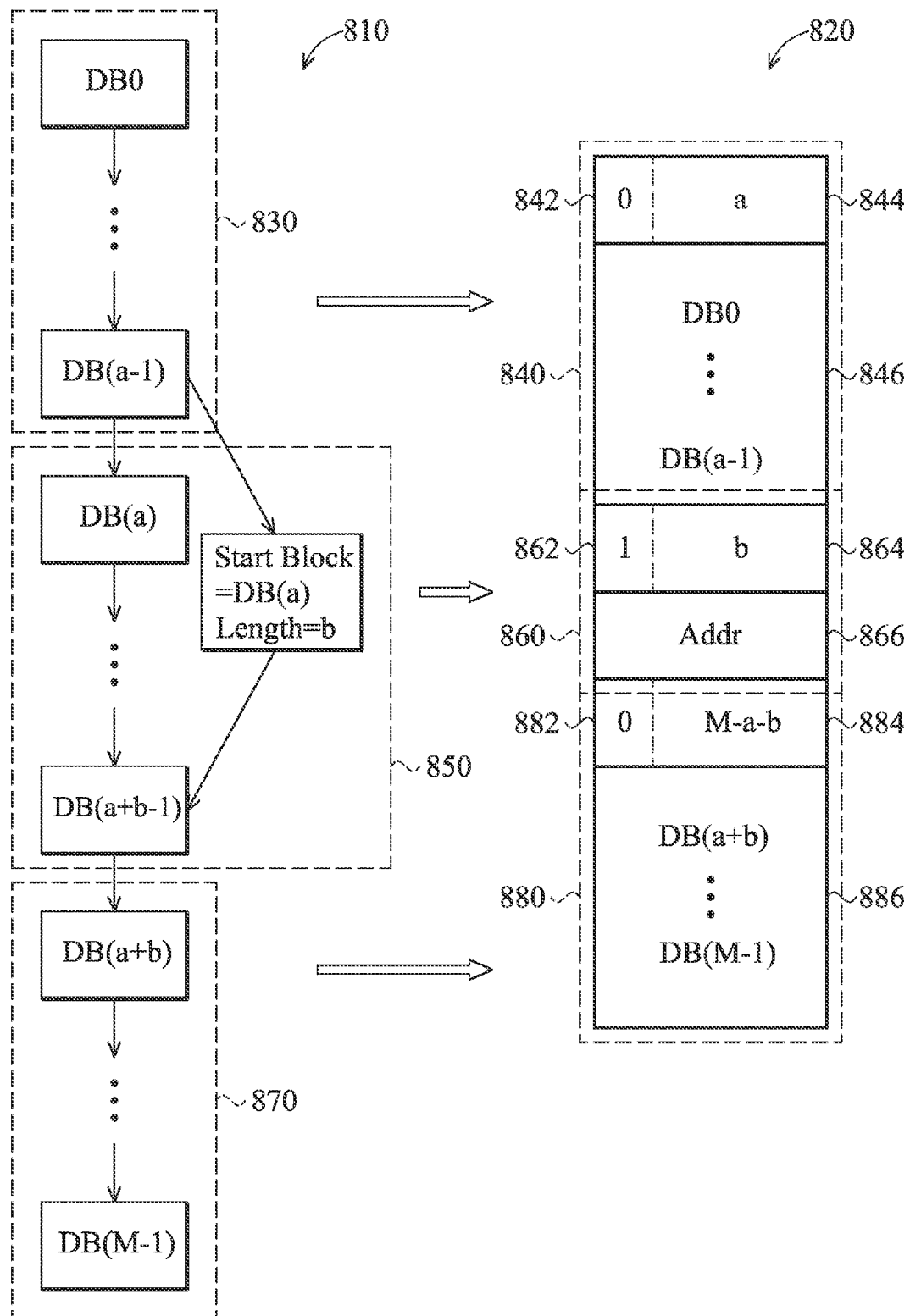
FIG. 8 shows a diagram illustrating encoding an EEPROM version to be updated by the control unit of FIG. 1 according to another embodiment of the invention.

FIG. 8 shows a diagram illustrating encoding an EEPROM version to be updated by the control unit 110 of FIG. 1 according to another embodiment of the invention, wherein label 810 represents a layout diagram illustrating an original data of the ROM code $DATA_{ROM}$ received by the control unit 110, and label 820 represents a layout diagram illustrating an EEPROM data of the ROM code $DATA_{ROM}$ encoded by the control unit 110 according the data programming method of FIG. 6. First, by searching for the shortest path having the minimum weight, the control unit 110 divides the ROM code $DATA_{ROM}$ into three data sections 830, 850 and 870, wherein the data section 850 has the shortest path having the minimum weight and corresponds to a specific data segment stored in the OTP memory, i.e. the data section 850 and the stored specific data segment have the same content. For the data sections 830 and 870, the control unit 110 directly and sequentially encodes the data blocks DB0 to DB(a−1) of the data section 830 into a data segment 840 and the data blocks DB(a+b) to DB(M−1) of the data section 870 into a data segment 880. In the data segment 840, the control unit 110 sets a flag field 842 to "0", to indicate that a segment data block 846 is raw data that has not been compressed (i.e. the data blocks DB0 to DB(a−1)), and stores a data length "a" into a length field 844. Similarly, in data segment 880, the control unit 110 sets a flag field 882 to "0", to indicate that a segment data block 886 is raw data that has not been compressed (i.e. the data blocks DB(a+b) to DB(M−1)), and stores a data length "M-a-b" into a length field 884. Furthermore, for the data section 850, the matching data segment in the shortest path comprises a plurality of data blocks between the data blocks DB(a−1) and DB(a+b). Therefore, in the shortest path, the control unit 110 may obtain that a start block of the matching data segment is DB(a), and a data length of the matching data segment (a quantity of data blocks within the matching data segment) is "b". Thus, in a data segment 860, the control unit 110 sets a flag field 862 to "1", to indicate that content of a segment data block 866 is a specific address Addr which points to a previously written specific data segment comprising data blocks DB(a) to DB(a+b−1). Moreover, the control unit 110 stores the data length "b" of the matching data segment into a length field 864. Finally, the control unit 110 sequentially writes the data segments 840, 860 and 880 into the free space of the OTP memory, so as to store the ROM code $DATA_{ROM}$ to be updated into the OTP memory.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data programming circuit, comprising:
a one-time-programmable (OTP) memory; and
a control unit, storing a plurality of sections of a read-only memory (ROM) code into a free space of the OTP memory, and storing a specific address into the OTP memory in response to the sections of the plurality of sections that have the same content,
wherein the control unit encodes the ROM code and determines whether the free space of the OTP memory is capable of storing the encoded ROM code, and when the free space of the OTP memory is capable of storing the encoded ROM code, the control unit writes a start address and an end address of the free space of the OTP memory, into a stack section of the OTP memory according to the encoded ROM code,
wherein the control unit stores the encoded ROM code into the free space of the OTP memory when the start and end addresses have been written into the stack section successfully.

2. The data programming circuit as claimed in claim 1, wherein the control unit writes the end address into a first field of a first block of the stack section and reads back the content of the first field, and when the read content of the first field is identical to the end address, the control unit writes the start address into a second field of the first block of the stack section and reads back the content of the second field, and when the read content of the second field is identical to the start address, the control unit determines that the start address and the end address have been written into the stack section successfully.

3. The data programming circuit as claimed in claim 2, wherein when the read content of the first field is different from the end address, the control unit determines that the first field of the first block is damaged and performs an error recovering procedure, so as to write the end address and an address corresponding to the first field into a second block of an error recovering section of the OTP memory.

4. The data programming circuit as claimed in claim 3, wherein when the read content of the second field is different from the start address, the control unit determines that the second field of the first block is damaged and performs the error recovering procedure, so as to write the start address and an address corresponding to the second field into a third block of the error recovering section of the OTP memory.

5. The data programming circuit as claimed in claim 3, wherein the stack section is located between the free space and the error recovering section of the OTP memory.

6. The data programming circuit as claimed in claim 1, wherein the control unit stores a first section of the plurality of sections into a first segment of the free space, and when the control unit determines that a second section of the plurality of sections has the same content as the first section, the control unit stores the specific address into a second segment of the free space, wherein the specific address points to the first segment of the free space.

7. The data programming circuit as claimed in claim 6, wherein when the control unit determines that the first and second sections have different content, the control unit stores the second section into the second segment of the free space.

8. The data programming circuit as claimed in claim 7, wherein data stored in the second segment is raw data that has not been compressed when the first and second sections have different content.

9. The data programming circuit as claimed in claim 1, wherein the control unit writes a byte of a first section of the plurality of sections into a first block of the free space and reads back the content of the first block, to determine whether the byte of the first section has been written into the free space or not.

10. The data programming circuit as claimed in claim 9, wherein when the read content of the first block is identical to the byte of the first section, the control unit determines that the byte of the first section has been written into the free space successfully.

11. The data programming circuit as claimed in claim 9, wherein when the read content of the first block is different from the byte of the first section, the control unit determines that the first block is damaged and performs an error recovering procedure, so as to write the byte of the first section and an address corresponding to the first block into a second block of an error recovering section of the OTP memory.

12. The data programming circuit as claimed in claim 11, wherein the stack section is located between the free space and the error recovering section of the OTP memory.

13. A data programming method for storing a read-only memory (ROM) code into a one-time-programmable (OTP) memory, comprising:
  encoding the ROM code;
  obtaining a start address and an end address of a free space of the OTP memory according to the encoded ROM code;
  writing the start and end addresses into a stack section of the OTP memory and determining whether the start and end addresses have been written into the stack section or not;
  writing the encoded ROM code into the free space of the OTP memory when the start and end addresses have been written into the stack section successfully; and
  storing a specific address into the free space of the OTP memory in response to the sections of the plurality of sections of the ROM code that have the same content.

14. The data programming method as claimed in claim 13, wherein the step of obtaining the start and end addresses further comprises:
  determining whether the free space of the OTP memory is capable of storing the ROM code according to the encoded ROM code; and obtaining the start and end addresses of the free space according to the encoded ROM code when the free space of the OTP memory is capable of storing the encoded ROM code.

15. The data programming method as claimed in claim 13, wherein the step of writing the start and end addresses into the OTP memory further comprises:
  writing the end address into a first field of a first block of the stack section;
  reading back the content of the first field from the stack section;
  writing the start address into a second field of the first block of the stack section when the read content of the first field is identical to the end address;
  reading back the content of the second field from the stack section; and
  determining that the start address and the end address have been written into the stack section successfully when the read content of the second field is identical to the start address.

16. The data programming method as claimed in claim 15, wherein the step of writing the start and end addresses into the OTP memory further comprises:
  determining that the first field of the first block is damaged and performing an error recovering procedure when the read content of the first field is different from the end address, so as to write the end address and an address corresponding to the first field into a second block of an error recovering section of the OTP memory; and
  determining that the second field of the first block is damaged and performing the error recovering procedure when the read content of the second field is different from the start address, so as to write the start address and an address corresponding to the second field into a third block of the error recovering section of the OTP memory.

17. The data programming method as claimed in claim 16, wherein the stack section is located between the free space and the error recovering section of the OTP memory.

18. The data programming method as claimed in claim 13, wherein the step of writing the ROM code into the free space of the OTP memory further comprises:
  storing a first section of the plurality of sections into a first segment of the free space;
  determining whether a second section of the plurality of sections and the first section have the same content; and
  storing the specific address into a second segment of the free space when the first and second sections have the same content, wherein the specific address points to the first segment of the free space.

19. The data programming method as claimed in claim 18, wherein the step of writing the ROM code into the free space of the OTP memory further comprises: storing the second section into the second segment of the free space when the first and second sections have different content.

20. The data programming method as claimed in claim 19, wherein data stored in the second segment is raw data that has not been compressed when the first and second sections have different content.

21. The data programming method as claimed in claim 13, wherein the step of writing the ROM code into the free space of the OTP memory further comprises:
  writing a byte of a first section of the plurality of sections into a first block of the free space;
  reading back the content of the first block from the free space;
  determining that the byte of the first section has been written into the free space successfully when the read content of the first block is identical to the byte of the first section; and
  determining that the first block is damaged and performing an error recovering procedure when the read content of the first block is different from the byte of the first section, so as to write the byte of the first section and an address corresponding to the first block into a second block of an error recovering section of the OTP memory.

22. The data programming method as claimed in claim 21, wherein the stack section is located between the free space and the error recovering section of the OTP memory.

* * * * *